(12) United States Patent
Cheng

(10) Patent No.: US 7,272,001 B2
(45) Date of Patent: Sep. 18, 2007

(54) EXTERNAL CONDUCTIVE HEAT DISSIPATING DEVICE FOR MICROCOMPUTERS

(75) Inventor: Wan Chen Cheng, Taipei (TW)

(73) Assignee: King Young Technology Co., Ltd. (TW)

( * ) Notice: Subject to any disclaimer, the term of this patent is extended or adjusted under 35 U.S.C. 154(b) by 95 days.

(21) Appl. No.: 11/222,399

(22) Filed: Sep. 9, 2005

(65) Prior Publication Data

US 2007/0058336 A1     Mar. 15, 2007

(51) Int. Cl.
*H05K 7/20*     (2006.01)
*G06F 1/20*     (2006.01)

(52) U.S. Cl. ............... 361/687; 361/704; 361/707; 361/719; 174/547

(58) Field of Classification Search ............ 361/679, 361/683, 687, 688, 707, 690, 710–717, 718, 361/719, 720, 721, 704; 174/252, 526, 547–548
See application file for complete search history.

(56) References Cited

U.S. PATENT DOCUMENTS

| | | | | |
|---|---|---|---|---|
| 4,628,407 A * | 12/1986 | August et al. | ............ | 361/711 |
| 5,521,792 A * | 5/1996 | Pleitz et al. | ............ | 361/715 |
| 5,742,478 A * | 4/1998 | Wu | ............ | 361/704 |
| 6,046,908 A * | 4/2000 | Feng | ............ | 361/707 |
| 6,268,239 B1 * | 7/2001 | Ikeda | ............ | 438/122 |
| 6,411,514 B1 * | 6/2002 | Hussaini | ............ | 361/704 |
| 6,580,611 B1 * | 6/2003 | Vandentop et al. | ...... | 361/704 |
| 2002/0162678 A1 * | 11/2002 | Takano | ............ | 174/52.1 |
| 2005/0152118 A1 * | 7/2005 | Cho | ............ | 361/707 |

* cited by examiner

*Primary Examiner*—Jayprakash Gandhi
*Assistant Examiner*—Robert J. Hoffberg

(57) ABSTRACT

A conductive heat dissipating device for microcomputers includes a motherboard having an opening and a first electric connector installed adjacent to the front side of the opening, an adapter board having a second electric connector connected to the first electric connector on the front side of the opening, a processor soldered at the back of the adapter board or a third electric connector for inserting a processor, such that the processor is placed upside down into the opening, and a heat dissipating board connected to the back of the motherboard and in contact with the surface of the processor, and the heat dissipating board is in contact with a special heat dissipating structure in a chassis to define an external conductive heat dissipating device capable of dissipating the heat to the outside, reducing the size of the microcomputer, shortening the distance of thermal conduction, and improving the heat dissipation.

3 Claims, 3 Drawing Sheets

EXTERNAL CONDUCTIVE HEAT DISSIPATING DEVICE FOR MICROCOMPUTERS

FIELD OF THE INVENTION

The present invention relates to an external conductive heat dissipating device for microcomputers, and more particularly to a conductive heat dissipating device capable of conducting the heat produced by a processor or other chips of a microcomputer to a chassis of the microcomputer.

BACKGROUND OF THE INVENTION

As the computer technology advances, particularly the nano technology and chip precision packaging technology are well developed, a single chip usually comes with powerful computation and storage functions, and the single chip becomes very compact, so that a motherboard can install many onboard application specific integrated circuits. Besides simplifying the complicated structure or process of installing display cards, sound cards, network cards, and other special function cards onto a motherboard of a desktop computer, the onboard design also can reduce the size and specification of the motherboard and give a compact and multifunctional computer system. For example, a motherboard usually includes a video chip, an audio chip, and a network chip, or even a central processing unit (CPU) soldered directly onto the motherboard. To meet different customer requirements and make the computer application easy without occupying too much space, the foregoing chips are integrated into a single chip installed onto a motherboard, and the motherboard is installed into a small chassis of a microcomputer system as shown in FIG. 2.

Since the chassis of a microcomputer is very small, the chassis can install a motherboard, a CPU, a memory and necessary disk drives only. The heat dissipation of the CPU and related chips cannot be achieved by the traditional heat dissipating device for desktop computers. In other words, the prior art heat sink that comes with a fan and a relatively tall structure no longer meets the requirements of the heat dissipating device for microcomputer systems. The microcomputer system avoids using additional heat dissipating device that will increase the size of the chassis, and thus an appropriate heat dissipating device is needed for dispersing the heat of the CPU and other related chips to maintain the stability of the operation of the computer system.

SUMMARY OF THE INVENTION

In view of the shortcoming of the prior art heat dissipating device of the desktop computer being too high and incompliant with the special specifications of the microcomputer system, the inventor of the present invention based on years of experience in the microcomputer field to conduct extensive researches and finally invented an external conductive heat dissipating device for microcomputers in accordance with the present invention.

Therefore, it is a primary objective of the present invention to overcome the shortcomings of the prior art by providing an external conductive heat dissipating device for microcomputers, and more particularly to a heat dissipating device that uses the application environment of the heat dissipating board and a special heat dissipating structure to quickly dissipate the heat from the heat dissipating chassis to the outside, so as to achieve the effects of meeting the requirements of the applications of the microcomputer system, reducing the size of the microcomputers, shortening the thermal conduction distance, and improving the heat dissipating performance.

To achieve the foregoing objective, the present invention comprises a motherboard, an adapter board, a heat dissipating board, and a heat dissipating chassis; wherein the motherboard has an opening disposed at a predetermined position, a first electric connector disposed adjacent to the front side of the opening of the motherboard, an adapter board for inserting or removing a second electric connector into or from the first electric connector at the front side of the motherboard, a processor being soldered at the backside of the adapter board or a third electric connector disposed at the backside of the adapter board for inserting a processor, so that the processor can be installed upside down in the opening of the motherboard, and the heat dissipation board is coupled to the backside of the motherboard and the contact surface of the processor, and the heat dissipating board is in contact with the internal surface of the heat dissipating chassis with a special heat dissipating structure. The heat dissipating board conducts the heat to the heat dissipating chassis and then discharges the heat to the outside.

DETAILED DESCRIPTION OF THE PREFERRED EMBODIMENTS

To make it easier for our examiner to understand the objective of the invention, its structure, innovative features, and performance, we use a preferred embodiment together with the attached drawings for the detailed description of the invention.

An external conductive heat dissipating device for microcomputers of the present invention as shown in the figures comprises a motherboard 1, an adapter board 2, a heat dissipating board 3, and a heat dissipating chassis 4 of a microcomputer.

Figure 1:
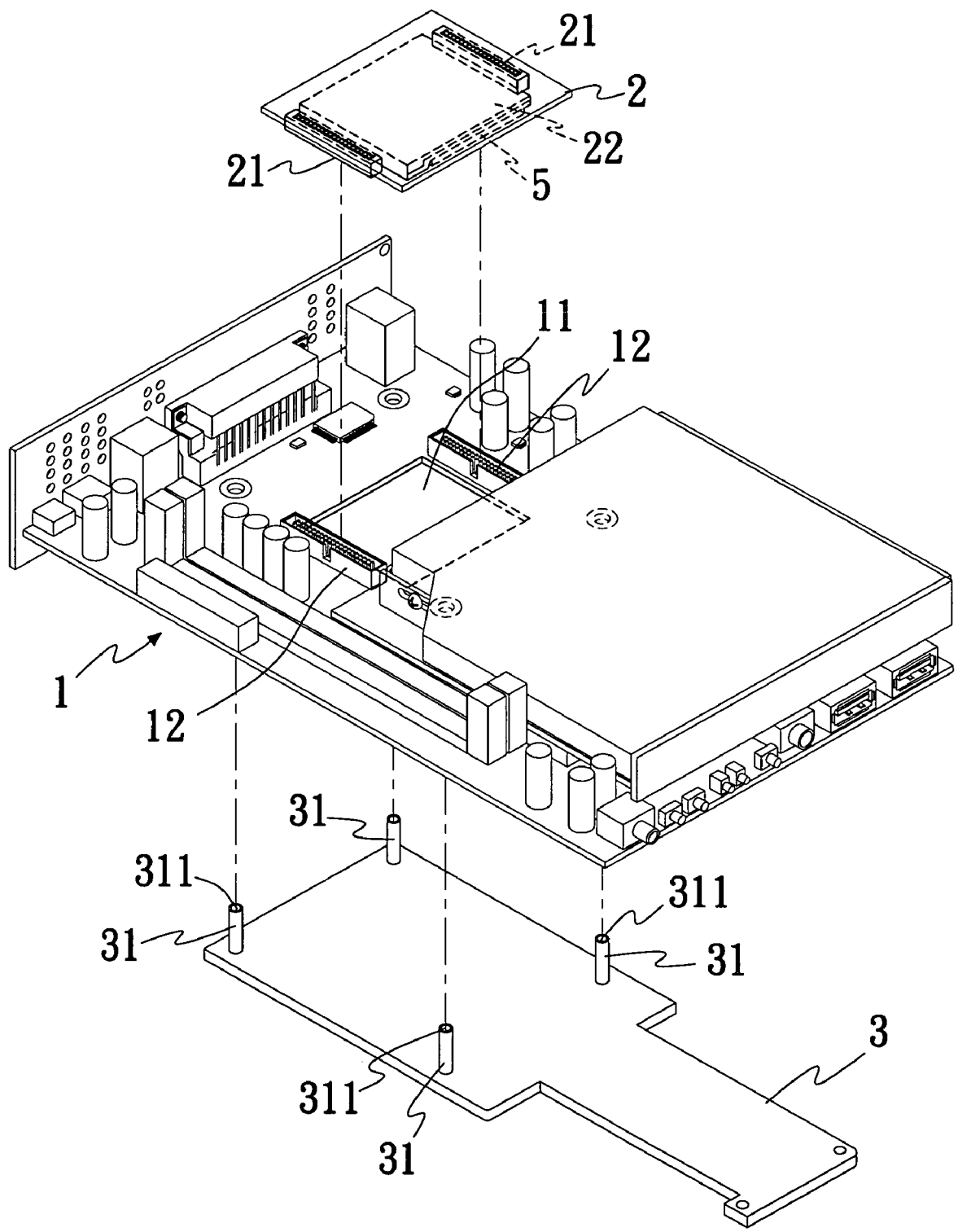
FIG. 1 is an exploded view of a partial structure of the present invention.

Referring to FIG. 1, a motherboard 1 is a circuit board of a special specification for microcomputers, and the motherboard 1 includes various chips (such as a display chip, an audio chip, and a network chip), various interface slots, ports, and other necessary electronic components installed at the front side of the motherboard 1, and the motherboard 1 is provided for installing a central processing unit (CPU). These components are prior art components and thus will not be described here. The motherboard 1 of the present invention includes at least one opening 11 penetrating to the backside of the motherboard 1, a first electric connector 12 installed on one side or both sides of the opening hole 11 at the front side of the motherboard 1 for quickly inserting an adapter board 2.

Figure 2:
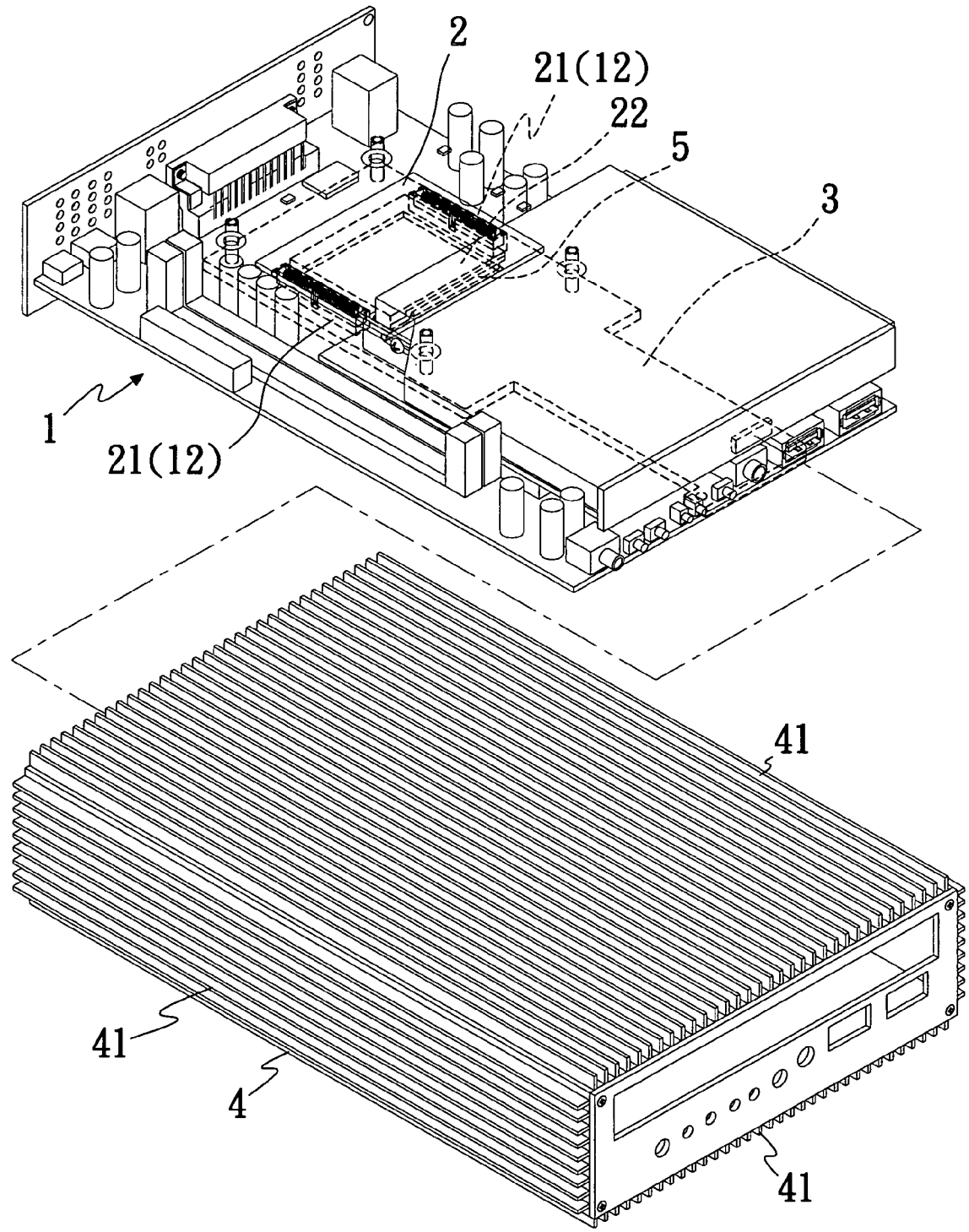
FIG. 2 is a schematic view of installing the components of the present invention.
Figure 3:
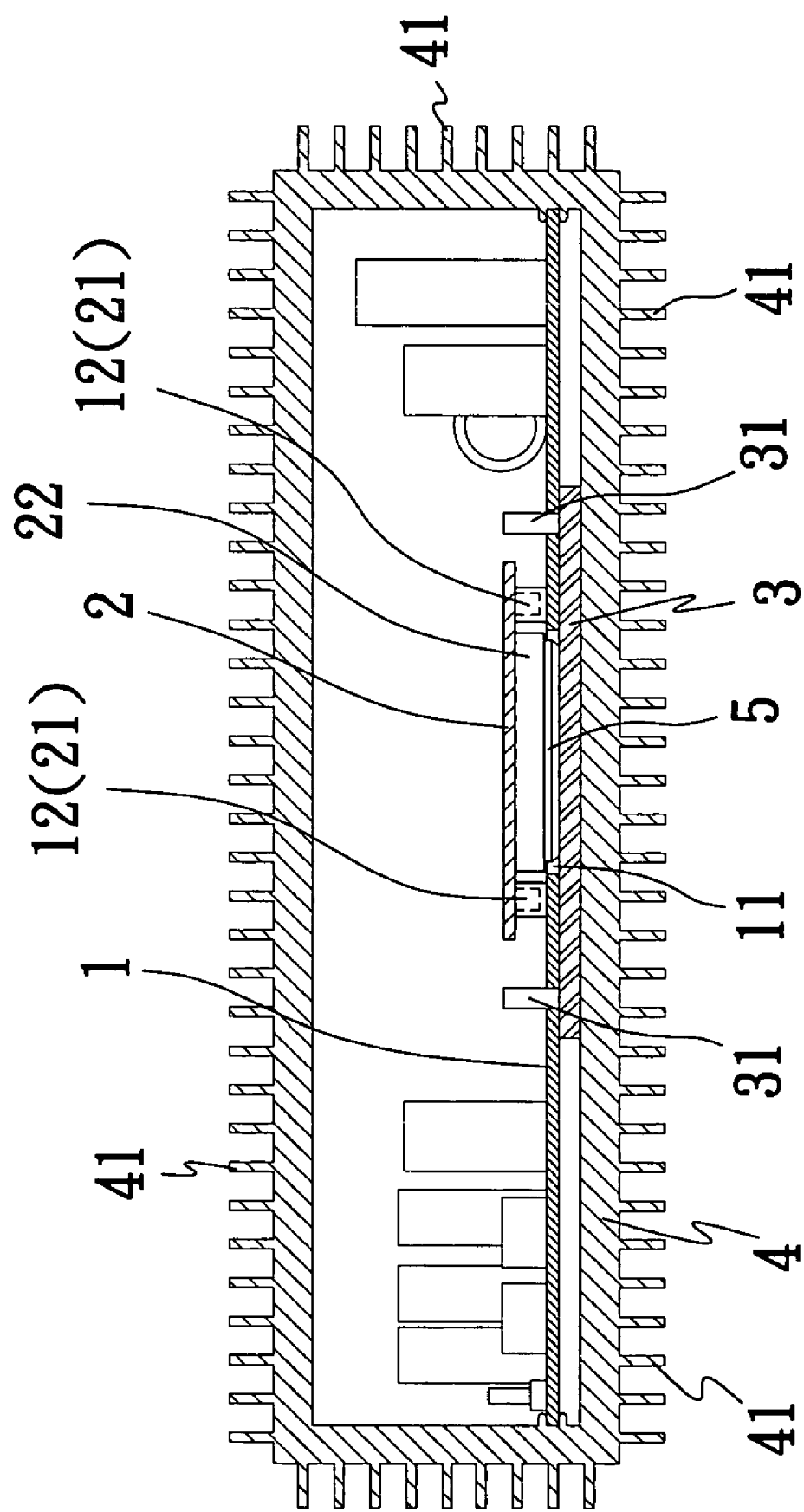
FIG. 3 is a cross-sectional view of a structure of the present invention.

Referring to FIGS. 1 to 3, the adapter board 2 is a printed circuit board having at least one of the first electric connectors 12 for connecting a second electric connector 21, so that the adapter board 2 can be installed horizontally to cover the opening 11 at the front side of the motherboard 1. A third electric connector 22 is disposed on the backside of the adapter board 2 for inserting a processor 5 (CPU) or other chips, or the processor or other chip is inserted into the third electric connector 22, so that the processor 5 can be placed upside down into the opening 11 of the motherboard 1, and its surface is exposed from the backside of the motherboard 1, and the processor 5 is electrically connected to the motherboard 1 through the adapter board 2 and the second electric connector 21.

Referring to FIGS. 1 to 3, the heat dissipating board 3 is made of a thermal conductive metal sheet (such as a copper sheet, an aluminum sheet, or other metal sheet) and fixed horizontally onto the backside of the motherboard 1, so that the internal side of the heat dissipating board 3 is in a direct contact with the surface of the processor 5 for absorbing the heat produced by the processor 5; wherein the external look of the heat dissipating board 3 is not limited to a particular shape, but it can be fixed onto the backside of the motherboard 1 by a plurality of fixing members 31 protruded at predetermined positions on the internal side of the heat dissipating board 3, and the fixing members 31 could be a vertical pillar having a locking hole 311 disposed at an end of the fixing member 31 for locking the motherboard 1 and fixing the heat dissipating board 3 to the motherboard 1.

Referring to FIGS. 2 and 3, the heat dissipating chassis 4 is a hollow chassis that meets the requirements of the special dimensions and specifications of the microcomputer and includes a plurality of heat dissipating fins 41 disposed at the external surface of the heat dissipating chassis 4. The heat dissipating chassis 4 is provided for accommodating the foregoing motherboard 1, the assembled adapter board 2, and the heat dissipating board 3, and the backside of the heat dissipating board 3 is in contact with the internal surface of the heat dissipating chassis 4, so that the heat absorbed by the heat dissipating board 3 can be conducted to the heat dissipating chassis 4 and discharged to the outside.

The external conductive heat dissipating device for microcomputers of the present invention is defined by the special assembly comprised of the motherboard 1, the adapter board 2, the heat dissipating board 3, and the heat dissipating chassis 4 and their space assembling relation, so that the adapter board 2 conducts the heat of the processor 5 to the heat dissipating chassis 4 and dissipates the heat to the outside. Therefore, the heat dissipating device of the invention is applicable for a microcomputer system and capable of reducing the size of the microcomputer, shortening the thermal conduction distance, and improving the heat dissipating performance.

The design of the external conductive heat dissipating device for microcomputers in accordance with the present invention installs the processor 5 onto the backside of the adapter board 2, and then installs the adapter board 2 into the opening 11 of the motherboard 1, and the surface of the processor 5 is exposed from the backside of the motherboard 1, such that the heat dissipating board 3 is in a direct contact with the surface of the processor 5 for conducting the heat to the heat dissipating chassis 4. The processor 5 installed upside down can save the space and reduce the overall height, and thus the invention facilitates the reduction of the height and size of the heat dissipating chassis 4 to meet the requirements of a compact computer system. The external conductive heat dissipating device of the present invention is applicable for microcomputers, and also can shorten the thermal conduction distance, since the heat is dissipated from the processor 5 and the heat dissipating chassis 4 to the outside. The present improves the heat dissipating performance and thus further maintaining the stability of the computer operation.

The design of the external conductive heat dissipating device for microcomputers of the present invention installs the processor 5 onto the backside of the adapter board 2, and the second electric connector 21 of the adapter board 2 is electrically connected to the first electric connector 12 of the motherboard 1. If the specification of the motherboard 1 or the processor 5 is upgraded, the interface between motherboard 1 and the processor 5 will not be compatible. The present invention allows users to change the adapter board 2, so that the motherboard 1 can be compatible to the adaptor board 2 with the processor 5, so as to save unnecessary waste of the components. As a result, the present invention can achieve the effect of saving costs.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. An external conductive heat dissipating device for microcomputers, comprising:
    a motherboard, having an opening disposed at a predetermined position of said motherboard and at least one first electric connector installed adjacent to the front side of said opening;
    an adapter board, having a second electric connector disposed at the backside of said adapter board and corresponding to said first electric connector, such that said adapter is disposed horizontally to cover said opening at the front side of said motherboard, and said adapter board includes a third electric connector disposed on the backside of said adapter board for inserting a processor, so that said processor is installed upside down into said opening of said motherboard;
    a heat dissipating board, fixed horizontally onto the backside of said adapter board, such that the internal surface of said heat dissipating board is in contact with the surface of said processor; and
    a heat dissipating chassis, for accommodating said motherboard, said adapter board, and said heat dissipating board therein, and said heat dissipating board is attached onto the internal surface of said chassis to define said external conductive heat dissipating device for microcomputers.

2. The external conductive heat dissipating device for microcomputers of claim 1, wherein said processor is soldered onto the backside of said adapter board and disposed upside down into said opening of said motherboard.

3. The external conductive heat dissipating device for microcomputers of claim 1, wherein said heat dissipating board comprises a plurality of fixing members protruded from predetermined positions of the internal surface of said heat dissipating board and fixed onto the front side of said motherboard, and said fixing member includes a locking hole disposed at an end of said fixing member for constituting a locking effect.

* * * * *